(12) United States Patent
Patel et al.

(10) Patent No.: US 6,886,353 B2
(45) Date of Patent: May 3, 2005

(54) COOLING SYSTEM

(75) Inventors: Chandrakant D. Patel, Fremont, CA (US); Cullen E. Bash, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 85 days.

(21) Appl. No.: 10/697,699

(22) Filed: Oct. 31, 2003

(65) Prior Publication Data

US 2004/0118136 A1 Jun. 24, 2004

Related U.S. Application Data

(62) Division of application No. 10/210,040, filed on Aug. 2, 2002.

(51) Int. Cl.[7] ........................ F25D 17/00; F25D 23/12; F25B 1/00; F25B 49/00

(52) U.S. Cl. .............................. 62/180; 62/185; 62/229; 62/259.2; 236/49.3; 361/696

(58) Field of Search ......................... 62/229, 185, 208, 62/178, 180, 259.2; 236/49.3; 361/696

(56) References Cited

U.S. PATENT DOCUMENTS

| 6,283,380 B1 | 9/2001 | Nakanishi et al. |
| 6,374,627 B1 | 4/2002 | Schumacher et al. |
| 6,557,624 B1 | 5/2003 | Stahl et al. |

*Primary Examiner*—Marc Norman

(57) ABSTRACT

A system and method for cooling a room configured to house a plurality of computer systems. A heat exchanger unit is configured to receive air from the room and to deliver air to the room. The heat exchanger unit is supplied with cooling fluid operable to cool the received air in the heat exchanger unit. At least one of the temperature of the cooling fluid supplied to the heat exchanger unit and the air delivery to the room may be controlled in response to temperatures sensed at one or more locations in the room.

24 Claims, 5 Drawing Sheets

COOLING SYSTEM

CROSS-REFERENCES

This is a division of application Ser. No. 10/210,040, filed Aug. 2, 2002.

The present invention is related to pending U.S. application Ser. No. 09/970,707, filed Oct. 5, 2001, and entitled "SMART COOLING OF DATA CENTERS", by Patel et al., U.S. application Ser. No. 10/157,892 filed on May 31, 2002 entitled "CONTROLLED COOLING OF A DATA CENTER", by Patel et al., U.S. application Ser. No. 10/122,210, filed on Apr. 24, 2002, and entitled, "DATA CENTER ENERGY MANAGEMENT SYSTEM", by Friedrich et al., all of which are assigned to the assignee of the present invention and are incorporated by reference herein in their entireties.

FIELD OF THE INVENTION

This invention relates generally to cooling systems.

BACKGROUND OF THE INVENTION

A data center may be defined as a location, e.g., room, that houses computer systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, cooling fluid, etc., across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically require a minimum of about thirty (30) percent of the required operating energy to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. For example, air conditioning systems are typically designed around the maximum capacity and redundancies are utilized so that the data center may remain on-line on a substantially continual basis. However, the computer systems in the data center may only utilize around 30–50% of the maximum cooling capacity. In this respect, conventional cooling systems often attempt to cool components that may not be operating at a level which may cause their temperatures to exceed a predetermined temperature range. Consequently, conventional cooling systems often incur greater amounts of operating expenses than may be necessary to sufficiently cool the heat generating components contained in the racks of data centers.

SUMMARY OF THE INVENTION

According to one embodiment, the present invention pertains to a method for cooling a room configured to house a plurality of computer systems. In the method, there is provided a heat exchanger unit configured to receive air from the room and to deliver air to the room. The heat exchanger unit is supplied with cooling fluid that is operable to cool the received air in the heat exchanger unit. In addition, temperatures at one or more locations in the room are sensed and at least one of the temperature of the cooling fluid and the air delivery to the room is controlled in response to the sensed temperatures at the one or more locations.

According to another embodiment, the invention relates a system for cooling a room containing one or more computer systems. The system includes a heat exchanger unit configured to receive cooling fluid through a fluid line and to receive air, where the air may be cooled through heat transfer with the cooling fluid. The heat exchanger unit has at least one fan configured to cause air to flow out of the heat exchanger unit. The system also includes a heat exchanger controller operable to control a supply of the cooling fluid to the heat exchanger unit and operable to control the speed of the at least one fan. The system further includes a device for cooling the cooling fluid and a cooling device controller configured to operate the device for cooling to vary the temperature of the cooling fluid.

According to yet another embodiment, the present invention pertains to a system for cooling computer systems housed in one or more racks maintained in a room. The system includes means for cooling air including means for receiving cooling fluid. The system also includes means for delivering cooled air to the computer systems and means for measuring temperatures at one or more locations in the room. Additionally, the system includes means for controlling delivery of the cooled air in response to the temperature measurements and means for controlling the temperature of the cooling fluid.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1:
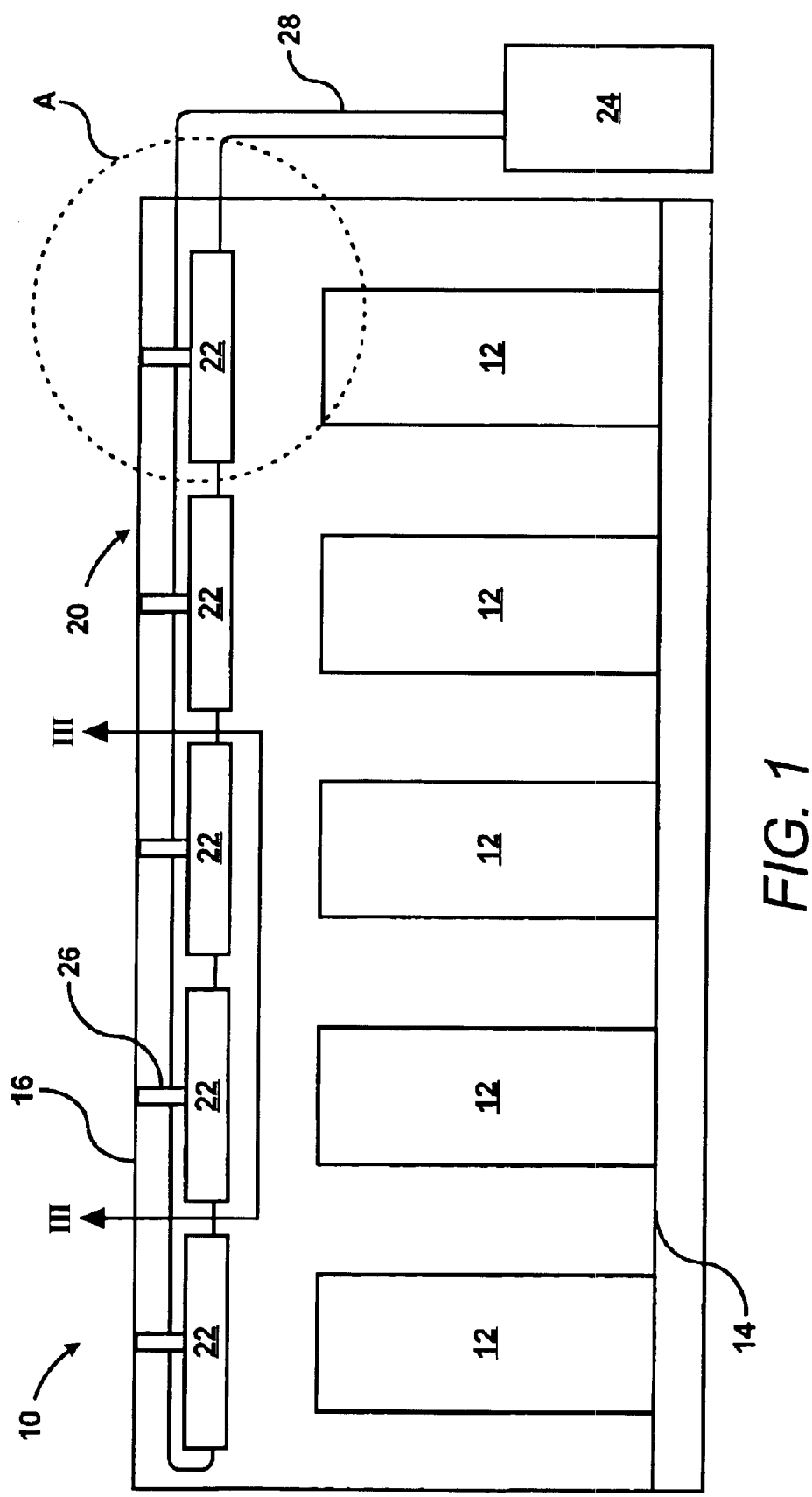
FIG. 1 shows a simplified schematic illustration of a room containing a cooling system in accordance with an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

According to an embodiment of the present invention, a cooling system may include a heat exchanger unit (HEU) configured to receive cooling fluid (e.g., chilled water, R134a, ethylene glycol mixture, and the like). The HEU may be designed to cause air to exchange heat with the cooling fluid to thereby cool the air. The HEU may also be designed to deliver the cooled air to one or more computer systems. The cooling system may also include a cooling device operable to cool the cooling fluid. The cooling device may comprise one or more of known cooling systems (e.g., a closed loop refrigeration cycle configured to transfer heat with the cooling fluid). The cooling device may therefore include a second generally closed-loop system having refrigerant flowing through a refrigerant line and positioned to receive heat from the cooling fluid.

One or more controllers may be provided to operate the cooling system components. The one or more controllers may be configured to monitor environmental conditions within the room, and more particularly in areas around predetermined computer systems, and manipulate operation of the HEU and the cooling device according to the monitored environmental conditions. For example, the one or more controllers may control the temperature of the cooling fluid and/or the output of the HEU.

In one respect, by manipulating the output of the HEU and the temperature of the cooling fluid, the amount of energy required to cool the computer systems may be relatively low. Thus, according to the embodiment described above, instead of operating components of the cooling device, e.g., compressors, heat exchangers, fans, etc., at substantially 100 percent of the anticipated heat dissipation from the computer systems, those components may be operated according to the actual cooling needs. In addition, the computer systems and the racks in which they are housed may be positioned throughout the room according to their anticipated heat loads, to additionally increase control over the energy required by the cooling system. Furthermore, as described in U.S. application Ser. No. 10/122,010, filed on Apr. 24, 2002, the loads may be distributed between various computer systems to further increase energy efficiency of air conditioning resources.

In another respect, the positioning of the racks may be determined through implementation of numerical modeling and metrology of the cooling fluid flow throughout the data center. In addition, the numerical modeling may be implemented to determine the volume flow rate and velocity of the cooling fluid flow through each of the HEU's.

A more detailed description of the above-described embodiment may be found in co-pending U.S. application Ser. No. 09/970,707, filed Oct. 5, 2001, which is assigned to the assignee of the present invention and is incorporated by reference herein in its entirety.

Referring first to FIG. 1, there is illustrated a room 10, e.g., a data center, housing a plurality of racks 12, and a cooling system 20. Also illustrated is a raised floor 14 that may be provided to enable placement of wires, tubes, and the like for delivery into and from the racks 12.

The racks 12 may generally house a plurality of components (not shown), e.g., processors, micro-controllers, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, may dissipate relatively large amounts of heat. Because the racks 12 have been generally known to include upwards of forty (40) or more subsystems, they may require substantially large amounts of cooling fluid to maintain the subsystems and the components generally within a predetermined operating temperature range. According to an embodiment of the invention, by substantially controlling the amount of cooling air delivered to the components and the subsystems located in the racks 12 based upon their respective heat loads, the power consumed by the cooling system 20 to cool and supply the cooling fluid may also be controlled.

The cooling system 20 is illustrated as including a plurality of HEU's 22 and a cooling device 24. The HEU's 22 may be supported from a ceiling 16 of the room 10 by one or more supports 26. The HEU's 22 may comprise any reasonably suitable air conditioning unit designed to receive air and to deliver the received air, e.g., the DATACOOL environmental control system manufactured and distributed by Liebert of Irvine, Calif. As can be seen in FIG. 1, the HEU's 22 are positioned to receive air that may become heated by virtue of the heat dissipated by, for example, the computer systems located in the racks 12. Although an HEU 22 is illustrated as positioned over a rack 12, it should be understood that the HEU's 22 may be positioned at various other locations. For example a plurality of HEU's 22 may be positioned to cool a single rack. Determinations of HEU 22 placement within the room 10 may be predicated upon techniques designed to optimize cooling performance and/or energy efficiency.

The HEU's 22 may be positioned to generally supply the racks 12 with cooling air. More particularly, the HEU's 22 may be positioned to supply cooling air to the racks 12 in accordance with their heat dissipation. By way of example, computer systems that undergo higher loads are known to generate greater amounts of heat as compared to computer systems that undergo lower or no loads. Thus, the HEU's 22 may be positioned and operated to supply those computer systems (and racks 12) that generate greater amounts of heat with greater mass flow rates of cooling air and/or relatively lower temperature air. In addition, those computer systems (and racks 12) that generate little or no heat, may likewise, receive little or no cooling air and/or relatively higher temperature air. In this respect, the amount of energy required to operate the HEU's 22 specifically, and the cooling system 20 as a whole, may be substantially optimized according to the demands of the computer systems.

Alternatively, or additionally to the above, because usage of the computer systems contained in the racks 12 may vary at different times of the day, instead of varying the position of the HEU's 22, the load placed on the computer systems may be varied. For instance, as described in co-pending U.S. application Ser. No. 10/122,010, the work load on some of the computer systems may be performed by other computer systems to substantially maximize energy efficiency of the cooling system. In this regard, the load may be transferred, for example, to one location in the room 10 if it is determined that such a load transfer is more energy efficient than under normal operating conditions. Moreover, the load transfer may occur at different times of the day and as load requirements vary.

The cooling device 24 may comprise any reasonably suitable type of cooling device designed to adequately cool the cooling fluid. In addition, the cooling device 24 may include the capability of varying the temperature of the cooling fluid. Some suitable cooling devices may include those that implement air conditioners, heat exchangers, heat pumps, variable capacity chillers, evaporative cooling systems, and the like. For example, the cooling device 24 may comprise a closed-loop refrigeration cycle apparatus having a heat transfer section where the heat from the cooling fluid in a fluid line 28 may be transferred to refrigerant contained in the closed-loop refrigeration cycle apparatus.

Although the cooling device 24 is illustrated as being located outside of the room 10, it should be understood that the cooling device 24 may be positioned within the room 24 without deviating from the scope of the present invention.

The cooling fluid may be configured to flow through the HEU's 22 and return to the cooling device 24 via fluid lines 28. As seen in FIG. 1, the fluid line 28 generally forms a closed loop system in which the cooling fluid may become heated in the HEU's 22 and cooled in the cooling device 24.

Although one room 10 is illustrated in FIG. 1, it should be understood that the room 10 may comprise more than one room and that the cooling system 20 may be configured to cool a plurality of rooms.

Figure 2:
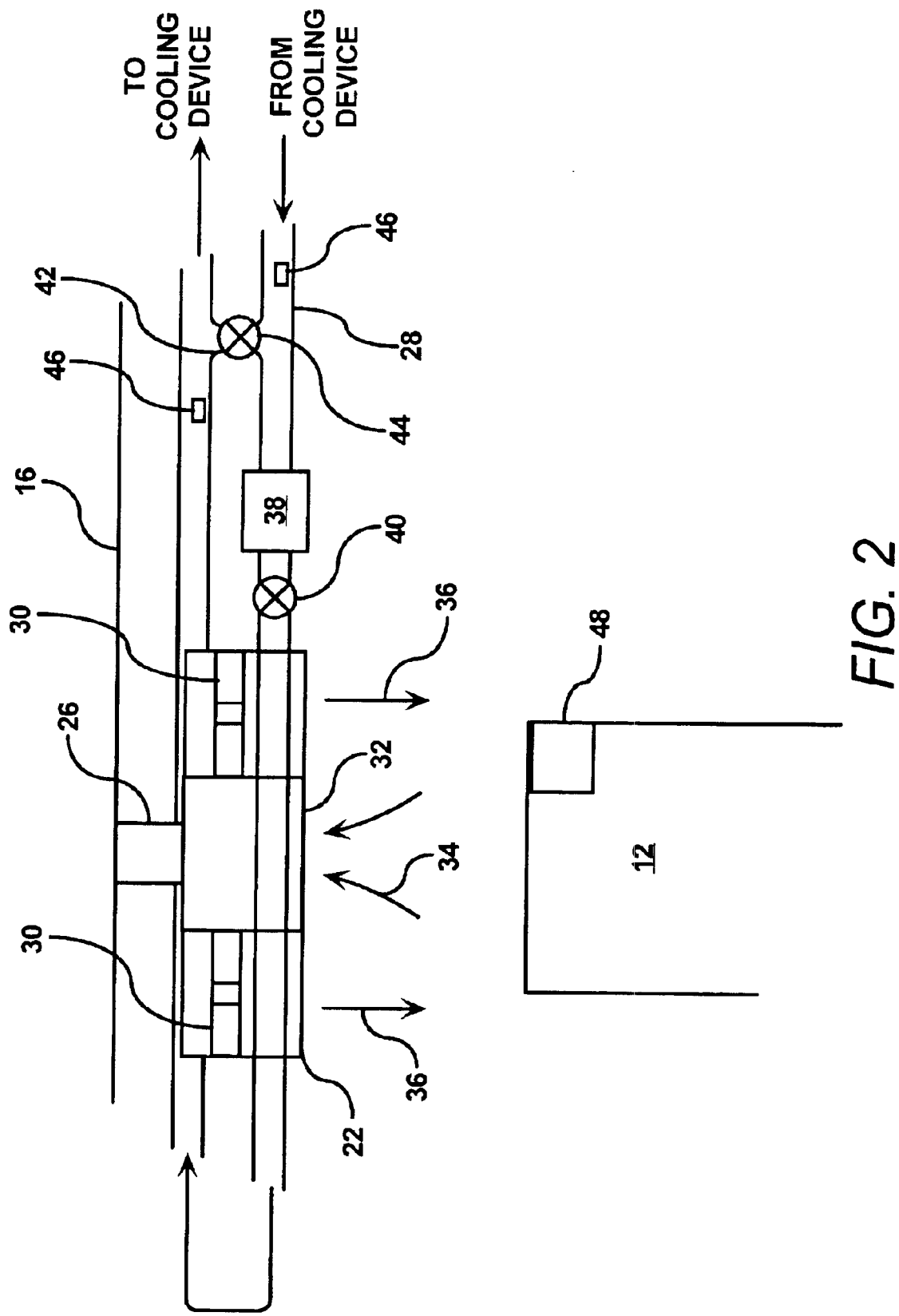
FIG. 2 is an enlarged partly cross-sectional view of section A in FIG. 1.

With reference now to FIG. 2, there is illustrated an enlarged partly cross-sectional view of section A in FIG. 1. As seen in FIG. 2, the HEU 22 generally comprises, among other things, a plurality of fans 30 and an opening 32. The fans 30 are designed to cause air from the room 10 to flow into the opening 32, as indicated by arrows 34. The fans 30 are also configured to cause the air to flow back out into the room 10, in the manner indicated by arrows 36. It should be understood that the HEU 22 may include additional components and that some of the components described may be removed and/or modified without departing from the scope of the invention.

The fluid line 28 is situated to run through the HEU 22 below the fans 30 and in the direction of air flow from the HEU 22 to the room 10. In this respect, as the air flows by the fluid line 28, heat may be transferred from the air to the cooling fluid contained in the fluid line 28. Consequently, the air flowing out of the HEU 22 may be at a lower temperature relative to the air entering the HEU 22.

A pump 38 may be provided along the fluid line 28 at a location generally upstream of the HEU 22. The pump 38 may be designed to apply sufficient pressure to the cooling fluid entering the HEU 22 to enable the cooling fluid to flow at a predetermined rate through the HEU 22. In this respect, the pump 38 may comprise any pump capable of performing the above-described operations in a reasonably suitable manner. The pump 38 may be configured to supply cooling fluid to a plurality of HEU's 22 and to control the pressure of the cooling fluid flowing through one or more of the HEU's 22. A valve 40 is illustrated between the pump 38 and the HEU 22 along the fluid line 28. The valve 40 may be an electronically controllable valve capable of varying the flow of cooling fluid through the fluid line 28, as well as substantially stopping the flow of the cooling fluid. As a result, the volume flow rate of the cooling fluid through the fluid line 28 extending through the HEU 22 may be manipulated at predetermined levels such that the temperature of the air flowing out of the HEU 22 may be substantially optimized.

Although the pump 38 and the valve 40 are illustrated as separate components, it should be understood that their respective functions may be performed by a single component, e.g., the pump 38. In this example, the pump 38 may be configured as a variable speed pump configured to vary the flow of cooling fluid through the HEU 22.

A pipe 42 may be located along the fluid line 28 at a location downstream of the HEU 22. The pipe 42 may enable cooling fluid that has passed through the HEU 22 to be introduced into cooling fluid entering into the HEU 22. A pipe valve 44 may be positioned along the pipe 42 to substantially control the amount of this cooling fluid introduced into the cooling fluid entering into the HEU 22. The pipe valve 44 may be any reasonably suitable valve (e.g., a three-way valve) capable of controlling the cooling fluid flow through the pipe 42.

In this respect, the temperature of the cooling fluid may thus be further controlled. By way of example, the temperature of the cooling fluid may be increased prior to its introduction into an HEU 22 in a multi-HEU system (see e.g., FIG. 3). In this type of configuration, when one rack 12 is dissipating a greater amount of heat relative to another rack 12, the temperature of cooling air flow supplied to each of these racks may differ from one another. That is, the rack 12 dissipating the greater amount of heat may receive air flow from a first HEU 22 that is at a lower temperature compared to the rack that is dissipating a lesser amount of heat. Consequently, the temperature of the cooling fluid introduced into that first HEU may be at a lower temperature than the cooling fluid introduced into a second HEU.

Temperature sensors 46 may be located in a supply portion and a return portion of the fluid line 28 such that a determination may be made as to changes in the cooling fluid temperature prior to and following flow through the HEU 22. This information may be implemented to determine the amount of return cooling fluid to be introduced into the supply portion of the fluid line 28.

A temperature sensor 48 e.g., a thermocouple or the like, is illustrated on the rack 12. A single temperature sensor 48 is depicted in FIG. 2 for purposes of simplicity, it should, however, be understood that a plurality of temperature sensors 48 may be positioned at various locations of the rack 12 as well as other areas of the room 12. The temperature sensor 48 may supply temperature readings to a controller (not shown) configured to operate the HEU 22, the pump 38, the valve 40, and the pipe valve 44. In addition, the temperature readings may also be supplied to a controller (not shown) configured to operate the cooling device 24. The manner of information transmittal between the temperature sensor 48 and the controllers may comprise any reasonably suitable arrangement, e.g., wired or wireless connection.

In place of, or in addition to, the temperature sensor 48, a mobile device (not shown) designed to gather or measure at least one local environmental condition (e.g., temperature, air flow, humidity, etc.) in the room 10 may be implemented. By way of example, a suitable mobile device may comprise the environmental condition detecting device described in co-pending U.S. application Ser. No. 10/157,892, filed on May 31, 2002 entitled "CONTROLLED COOLING OF A DATA CENTER", by Patel et al., which is assigned to the assignee of the present invention and incorporated by reference herein in its entirety. Information gathered by the mobile device may be transmitted to the controller, which may vary operation of the cooling system 20 in response to the information.

Alternatively, or in addition to, the above-described environmental condition sensing devices, the amount of heat generated by the computer systems contained in the racks 12, and the resulting necessary cooling requirements, may be anticipated according to the amount of load placed on the computer systems. A suitable method of implementing anticipated sensing is described in co-pending U.S. application Ser. No. 09/970,707, which is assigned to the assignee of the present invention and incorporated by reference herein in its entirety.

Figure 3:
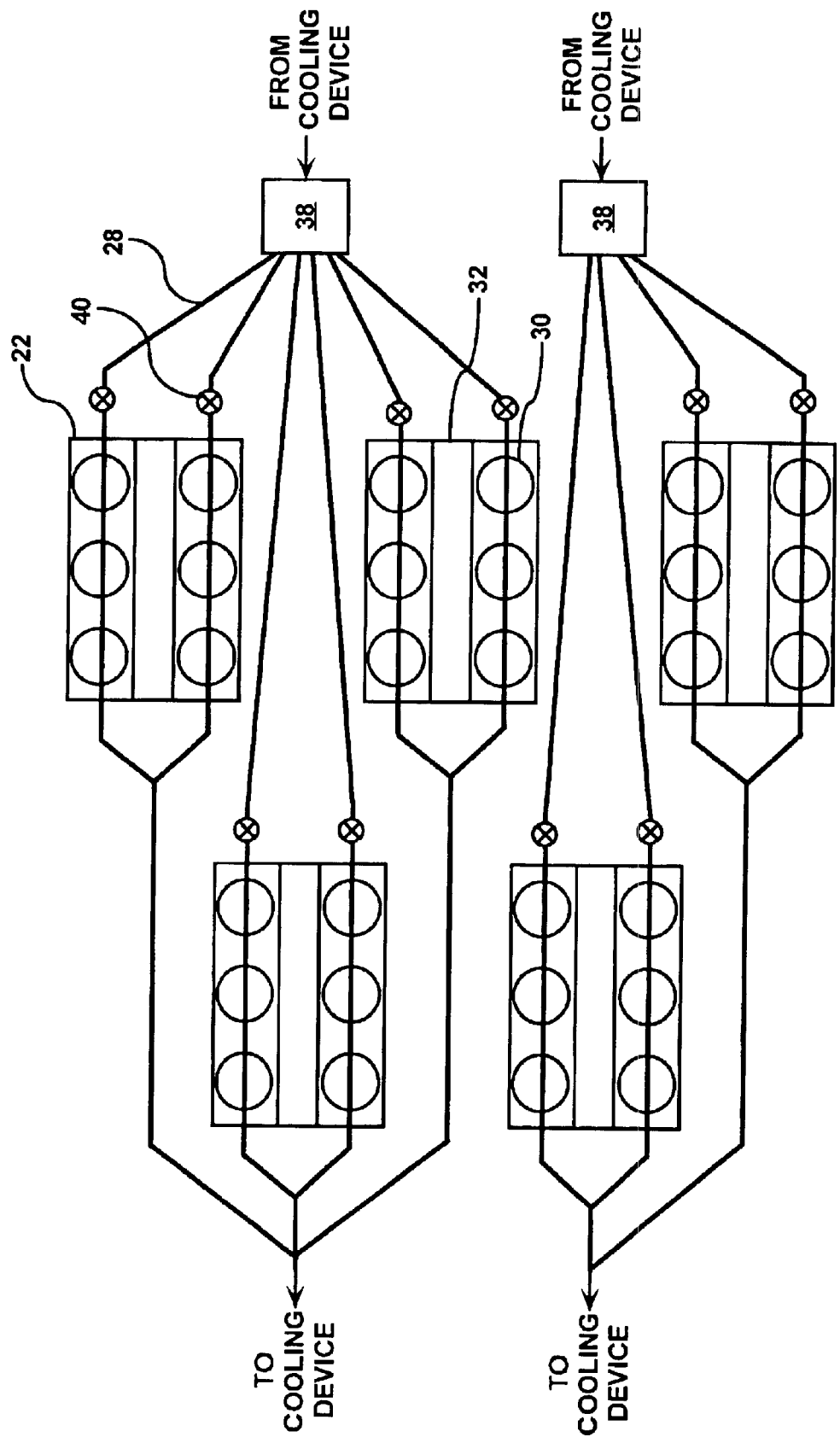
FIG. 3 is a schematic illustration taken along lines III—III of FIG. 1.

Referring now to FIG. 3, there is shown a schematic illustration taken along lines III—III of FIG. 1. FIG. 3 illustrates a plurality of HEU's 22 and a plurality of fluid lines 28 emanating from a pair of pumps 38. The illustration also shows that the HEU's 22 include rows of fans 30 located adjacent to the openings 32. Situated beneath each of the fans 30 are fluid lines 28. In addition, located generally upstream of the HEU's 22 are respective valves 40, which may comprise three-way valves. As can be seen in FIG. 3, the pumps 38 may control the supply of cooling fluid through a plurality of HEU's 22. In addition, it may be seen that the valves 40 generally enable control of cooling fluid flow through respective fluid lines 28.

In this respect, the temperature of the air flowing out of the HEU's 22, and more specifically, out of each side of the HEU's 22 may be controlled in substantially independent manners (e.g., by operation a three-way valves (not shown)). In one regard, the flow of cooling fluid through certain HEU's 22 may be restricted or substantially halted, for instance, in situations where the computer systems for which an HEU 22 is configured to cool are in idle states. It should be understood that the configuration of HEU's 22, pumps 38, fluid lines 28, and valves 40 depicted in FIG. 3 is but one manner of a variety of different obtainable configurations. It should also be understood that the specific configuration for any given room may depend upon a multitude of factors, e.g., cooling needs, room configuration, cooling device type, etc. In addition, the fluid lines 28 may be positioned above the fans 30 such that air may substantially be cooled prior to flowing into the fans 30 without deviating from the scope of the present invention.

Figure 4:
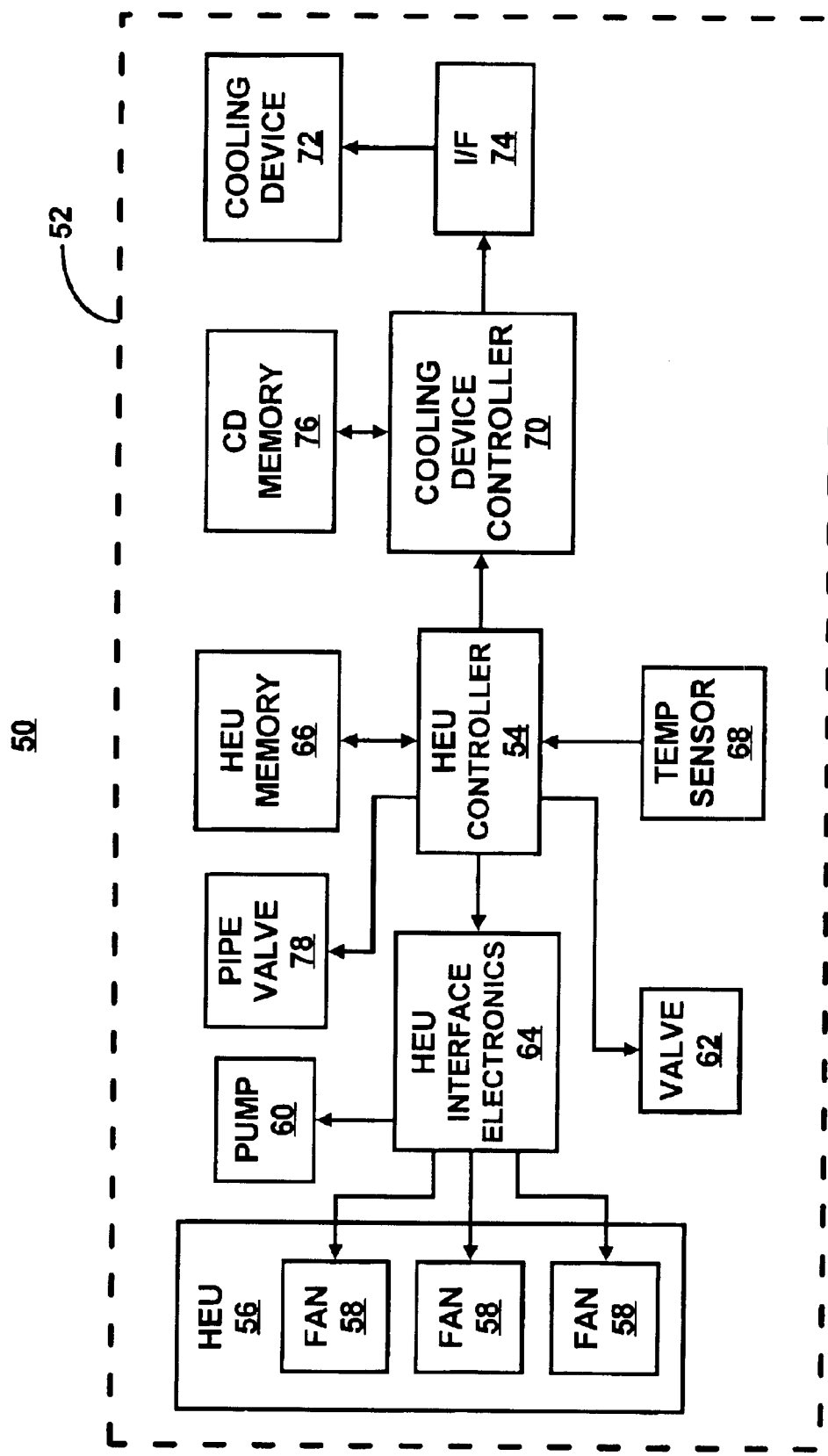
FIG. 4 is an exemplary block diagram for a cooling system according to an embodiment of the invention.

FIG. 4 is an exemplary block diagram 50 for a cooling system 52 according to an embodiment of the invention. It should be understood that the following description of the block diagram 50 is but one manner of a variety of different manners in which such a cooling system 52 may be operated. In addition, it should be understood that the cooling system 52 may include additional components and that some of the components described may be removed and/or modified without departing from the scope of the invention.

The cooling system 52 includes an HEU controller 54 configured to control the operations of the HEU 56. The HEU controller 54 may comprise a microprocessor, a microcontroller, an application specific integrated circuit (ASIC), and the like. The HEU controller 54 may, for example, control the speed of the fans 58, the operation of the pump 60, the valve 62, and the pipe valve 78. Interface electronics 64 may be provided to act as a control interface between the HEU controller 54 and the HEU 56, pump 60, and valve 62. Alternatively, a control interface my be omitted between the HEU controller 54 and the above-described components as seen with respect to the connection between the HEU controller 54 and, for example, the pipe valve 78. The HEU controller 54 may also be interfaced with a temperature sensor 68, e.g., one or more of the temperature sensors described hereinabove with respect to FIG. 2.

The HEU controller 54 may be interfaced with an HEU memory 66 configured to provide storage of a computer software that provides the functionality of the HEU controller 54, e.g., the speed of the fans, pump operation, etc. The HEU memory 66 may be implemented as a combination of volatile and non-volatile memory, such as dynamic random access memory (DRAM), EEPROM, flash memory, and the like. The HEU memory 66 may also be configured to provide a storage for containing data and/or information pertaining to the manner in which HEU controller 54 may operate the fans 58, the pump 60, the valve 62, and the pipe valve 78. In one respect, the manner of operation of the above-described components may be based according to temperature measurements by the temperature sensor 68.

The HEU controller 54 may be further interfaced with a cooling device controller 70. The interface may be effectuated via a wired protocol, such as IEEE 802.3, etc., wireless protocols, such as IEEE 801.11b, wireless serial connection, Bluetooth, etc., or combinations thereof.

The cooling device controller 70 may be configured to control the operations of the cooling device 72. The cooling device controller 70 may comprise a microprocessor, a micro-controller, an application specific integrated circuit (ASIC), and the like. The cooling device controller 70 is generally configured to manipulate the temperature of the cooling fluid by controlling the operation of the cooling device 72. In this regard, the cooling device 72 may comprise a variable speed compressor, a heat exchanger, a chilled water heat exchanger, a centrifugal chiller, and the like. More particularly, the cooling device controller 70 may be designed to vary the operation of one or more of the above-recited components to vary the amount of heat transfer on the refrigerant contained in the refrigeration loop of the cooling device 72 to thereby vary the cooling fluid temperature.

Interface electronics (I/F) 74 may be provided to act as an interface between the cooling device controller 70 and the components for operating the cooling device 72, e.g., the supply of voltage to vary the speed of the compressor, control of the heat exchanger (centrifugal chiller) capacity, etc.

The cooling device controller 70 may also be interfaced with a cooling device (CD) memory 76 configured to provide storage of a computer software that provides the functionality of the cooling device 72, e.g., compressor, heat exchanger, and the like, and may be executed by the cooling device controller 70. The CD memory 76 may be implemented as a combination of volatile and non-volatile memory, such as DRAM, EEPROM, flash memory, and the like. The CD memory 76 may also be configured to provide a storage for containing data/information pertaining to the manner in which the compressor (heat exchanger, chiller) may be manipulated in response to, for example, variations in the temperature of the cooling fluid and/or air in the room.

In one respect, the capacity (e.g., the amount of work exerted on the cooling fluid) of the compressor (heat exchanger, chiller, etc.) may be modified to thereby control the temperature and of the cooling fluid. The compressor (heat exchanger, chiller, etc.) may thus be controlled to either increase or decrease the mass flow rate of the refrigerant flowing therethrough. Consequently, when the temperature in the room 10 is below a predetermined range, the capacity of the (heat exchanger, chiller, etc.) may be reduced to substantially reduce the amount of work, thus the amount of energy exerted on the refrigerant. This may lead to a significant reduction in the costs associated with operating the cooling system 52 as compared with conventional cooling systems.

Because the specific type of compressor (heat exchanger, chiller, etc.) to be employed with embodiments of the invention may vary according to individual needs, the invention is not limited to any specific type of compressor (heat exchanger, chiller, etc.). Instead, any reasonably suitable type of compressor (heat exchanger, chiller, etc.) capable of accomplishing certain aspects of the invention may be employed with the embodiments of the invention. The choice of compressor (heat exchanger, chiller, etc.) may therefore depend upon a plurality of factors, e.g., cooling requirements, costs, operating expenses, etc.

By way of example, if there is a detected or anticipated change in the temperature of a rack, e.g., rack 12, areas surrounding the rack, etc., the HEU controller 54 may operate to manipulate the corresponding HEU 56 and/or fan(s) 58 to compensate, e.g., change the volume flow rate, velocity, and other characteristic of the air flow, for the change in temperature. In addition, or as an alternative to the above, the cooling device controller 70 may operate to cause the cooling device 72 to lower the refrigerant temperature. In this respect, each of the racks 12 and/or portions thereof may generally receive substantially only the amount of cooling air necessary to maintain the temperature of the racks 12 within a predetermined temperature range. In addition, the refrigerant, and therefore the cooling fluid, temperature may also be controlled as needed to substantially optimize cooling of the racks 12. By controlling the cooling air flow in the above-described manner, the cooling system 52 may be operated at substantially optimized levels, thereby decreasing the amount of energy and thus the operating costs required to cool the computer systems in the racks 12.

Moreover, the cooling device controller 70 may operate the compressor (heat exchanger, chiller, etc.) in a manner to vary the cooling fluid temperature in response to various degrees of detected increases/decreases in the operation of the HEU 56. More particularly, a look up table (not shown) may be stored in the CD memory 76. The look up table may include information pertaining to the level of compressor speed (heat exchanger capacity, etc.) increase necessary for a detected increase in the operation of the HEU 56. In this respect, the compressor speed (heat exchanger capacity, etc.) may be varied substantially incrementally in response to detected changes in the operation of the HEU 56.

Figure 5:
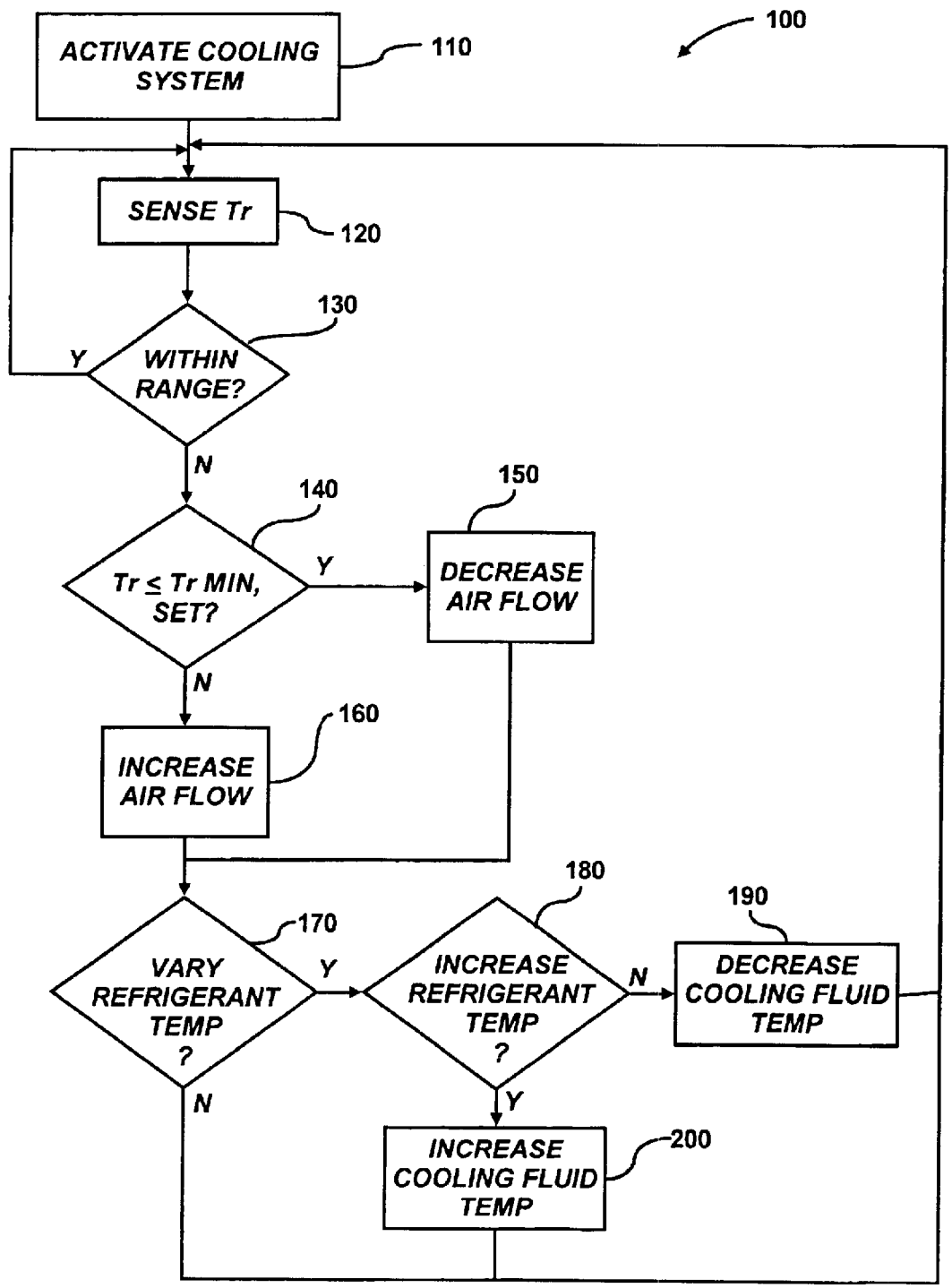
FIG. 5 shows a flow diagram of an operational mode according to an embodiment of the invention.

FIG. 5 shows a flow diagram of an operational mode 100 according to an embodiment of the invention. It should be understood that the operational mode 100 may include additional operations and that some of the operations may be removed and/or modified without departing from the scope of the invention. The following description of the operational mode 100 is made with reference to the block diagram 50 illustrated in FIG. 4, and thus makes reference to the elements cited therein.

The operations illustrated in the operational mode 100 may be contained as a utility, program, or a subprogram, in any desired computer accessible medium. In addition, the operational mode 100 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the operational mode 100, the cooling system 52 is activated at step 110. At step 120, the temperature of one or more racks (Tr) is sensed by temperature sensors, e.g., one or more temperature sensors 68. The temperature sensors may comprise one or more of the above-described temperature sensors, e.g., thermocouple, mobile environmental condition sensing device, etc. The Tr's generally correspond to the heat load of the heat dissipating components and therefore the computer systems contained in the racks, e.g., rack 12. Therefore, the Tr's may be based upon the temperatures of specific heat dissipating components and subsystems. In addition, the Tr's may be based upon the temperatures in the general vicinity of the racks and/or sections of the racks. Thus, those skilled in the art will understand that certain embodiments of the present invention may be employed with temperature sensors located at various positions throughout the room, e.g., room 10. Moreover, use of the term "rack" herein generally refers to racks for supporting computer systems and additionally to sections of the racks as well as areas around the racks. Therefore, the use of the term "rack" throughout the present disclosure is not meant to limit certain aspects thereof to entire racks, but instead, is relied upon to simplify the description of certain embodiments of the present invention.

As an alternative to the temperature sensor 68, the Tr's may be anticipated in the manner described hereinabove and in co-pending U.S. patent application Ser. No. 09/970,707.

At step 130, it is determined whether each of the Tr's is within a predetermined range of operating temperatures, e.g., between a maximum set point temperature (Tmax,set) and a minimum set point temperature (Tmin,set). In general, the range of temperatures Tmin,set and Tmax,set pertains to threshold temperatures to determine whether to increase or decrease the flow of cooling air delivered to the racks. This range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another.

For those racks having Tr's that are within the predetermined range, their temperatures are sensed again at step 120. For those racks determined to have heat loads that do not fall within the predetermined temperature range, i.e., fall outside of Tmin,set and Tmax,set, the HEU controller 54 may determine whether those racks have temperatures that are below the Tmin,set at step 140.

The air flow supplied by the HEU 56, and more particularly the fans 58, configured to supply cooling air flow to the racks having Tr's below or equal to the Tmin,set, may be decreased at step 150. In addition, and/or alternatively, the temperature of the cooling fluid supplied through the HEU's 56 may be increased to thereby increase the temperature of the air supplied to these racks. As described hereinabove, this may be accomplished by decreasing the work placed on the refrigerant by the cooling device 72 and/or by opening the bypass valve 62. Additionally, the temperature of the air flowing from the HEU 56 may also be increased by causing the valve 78 to enable a lower volume flow rate of cooling fluid to flow therethrough.

The air flow supplied by the HEU 56 configured to supply cooling air flow to the racks having Tr's above the Tmin,set, and thus above the Tmax,set, may be increased at step 160. In this regard, the HEU controller 54 may increase power to the fans 58 to enable greater air flow to the racks. In addition, and/or alternatively, the HEU controller 54 may increase the flow of cooling fluid through the HEU 56 via operation of the pump 60 and/or the valve 78.

By virtue of certain embodiments of the invention, racks having various Tr's may be supplied with air flow having various characteristics, e.g., temperature, velocity, direction, and the like. That is, for example, in a system comprising a plurality of HEU's 56, air flow may be supplied to racks having higher Tr's by certain HEU's 56 substantially simultaneously with air flow supplied to racks having relatively lower Tr's by other HEU's 56 where each of the racks receives different levels of air flow. Additionally, the temperature of the cooling fluid supplied through the HEU's 56 delivering air flow to racks having higher Tr's may be relatively lower than the temperature of the cooling fluid supplied through the HEU's 56 delivering air flow to racks having lower Tr's. It should thus be appreciated that steps 150 and 160 may be respectively and substantially simultaneously performed by various HEU's 56.

According to an embodiment of the invention, the decrease in volume flow rate and/or velocity of the air flow at step 150 and the increase in volume and/or velocity of the air flow at step 160 may be accomplished by incrementally varying the air flow from the HEU 56. For example, the volume flow rate and/or velocity of the air flow from the HEU 56 may be varied by a predetermined amount during a first iteration. The Tr may be measured at a predetermined time following the variation and steps 130–160 may be repeated. By repeating this process a number of times, the temperature of the rack may be substantially brought within the predetermined range.

At step 170, the cooling device controller 70 may determine whether to vary the cooling fluid temperature, e.g., increase the compressor speed (heat exchanger capacity, etc.). The cooling fluid temperature may be decreased in response to, for example, actual and/or detected increases in Tr. In the alternative, the decrease in cooling fluid temperature may be predicated upon the amount of work performed by the HEU 56. More particularly, as the work performed by the HEU 56 increases, thereby signaling an increase in the Tr, the cooling device controller 70 may cause the cooling device 72 to decrease the refrigerant temperature. In addition, when a plurality of HEU's 56 are implemented to cool one or more racks, the cooling device controller 70 may determine whether the total amount of decreases in the volume flow rates of the cooling air exceeds the total amount of increases in the volume flow rates flow of the cooling air. At step 180, the cooling device controller 70 may determine whether to decrease the cooling fluid temperature.

At step 190, the cooling device controller 70 may cause the cooling fluid temperature to be decreased in response to a determination to do so at step 180. Alternatively, the cooling device controller 70 may cause the cooling fluid temperature to be increased at step 200 in response to a determination to do so at step 180. As described hereinabove, the cooling device controller 70 may operate to vary the temperature of the cooling fluid by varying the speed of the compressor, capacity of the heat exchanger, and the like.

It should be understood that steps 150, 160, and 190 or 200 may be performed substantially simultaneously. More particularly, on a zonal level, temperature readings determined at step 120 for various racks may be implemented in varying the delivery of cooling air to the various racks. Additionally, on a global level, the temperature of the cooling fluid may be varied according to the changes in the cooling requirements of the racks. For example, when the temperature of a rack exceeds a predetermined threshold range, the HEU(s) 56 supplying cooling air flow to that rack may increase the air flow to that rack. Substantially concurrently, the temperature of the cooling fluid may be decreased by an amount relative to the increased rack temperature.

Following steps 190 or 200, the Tr's are sensed again at step 120. In addition, the steps following step 120 may be repeated for an indefinite period of time and may form a closed-loop pattern.

In accordance with embodiments of the present invention, the cooling requirements of a room configured to house computer systems may be analyzed to substantially optimize the layout of the racks within the room. In one respect, the substantial optimization of the rack layout in the room may enable the cooling system of the data center to operate at generally lower energy and greater efficiency levels by virtue of the reduced workload placed on the components of the cooling systems, e.g., compressors, HEU's, etc. In addition, the cooling requirements may be analyzed to optimize the workload of the computer systems as described above. In this regard, the actual or anticipated temperatures may be stored in a look-up table and used as references in optimizing the room layout and/or workload distribution. The cooling requirements within the room may be analyzed by operation of any reasonably suitable commercially available computational fluid dynamics (CFD) tool, e.g., FLOVENT, a 3-D modeling software capable of predicting temperature variations based upon fluid flow analyses.

By virtue of the numerical modeling, various cooling devices as well as the HEU's described hereinabove may be positioned throughout the room to substantially control the manner in which the racks receive the cooling fluid.

In addition, the cooling devices may also be positioned to substantially maximize and optimize their performances, e.g., to prevent one or more of the cooling devices from operating at substantially excessive levels.

In determining the cooling air distribution requirement within the room, each of the racks may be assigned a heat load which may correspond to a maximum heat load predicted for that rack, e.g., through anticipated power draw. For example, a rack containing 40 subsystems, e.g., computers, may have a maximum heat load of 10 KW and a rack containing 20 subsystems may have a maximum heat load of 5 KW. By implementing the CFD in this manner, for example in a room containing 100 racks, four cooling devices, and a plurality of HEU's, racks having a potential for relatively larger heat loads may be relatively separately located throughout the data center. In one respect, therefore, the cooling devices and the HEU's within the room may be operated at substantially less than maximum power levels while the racks may receive sufficient amounts of cooling fluid. More specifically, the power required to operate the cooling devices and the HEU's may be regulated to efficiently supply cooling fluid to the racks by providing substantially only that amount of cooling fluid necessary to maintain the racks within nominal operating temperatures.

Additionally, a CFD tool may be implemented substantially simultaneously with the cooling system. More specifically, the CFD tool may be utilized to substantially continuously vary the operation of the cooling system to operate according to the heat loads generated in the racks. In this regard, the anticipated or actual heat loads (e.g., based upon the power draw of the components) on the racks may be inputted into the CFD tool, along with one or more of the following properties: velocity of the cooling fluid flowing through various sections of the room and the distribution of temperature and pressure of the cooling fluid in the data center, to determine an optimal manner in which, for example, the HEU's may be operated. The velocity of the air flow as well as other atmospheric conditions at various locations within the room may be sensed by a temperature sensor. The sensed conditions may be transmitted or otherwise relayed to the CFD tool to enable the tool to perform the necessary calculations.

In this regard, the CFD tool may be implemented to produce a numerical model of the room to thus determine an optimized cooling distribution within the room. A correlation of one or more of the following properties: velocity of the cooling fluid flowing through various sections of the room, distribution of temperature and pressure of the cooling fluid in the room, and the power draw into the racks, may be created based on the numerical modeling. The correlation may be used to infer thermal conditions throughout the room when only a minimum number of sensors are available during operation of the cooling system. In addition, the correlation may substantially reduce the amount of time required for the CFD tool to perform the computing operations.

By virtue of certain embodiments of the present invention, one of ordinary skill in the art will readily recognize that the amount of energy, and thus the costs associated with cooling the racks located within a room may be substantially reduced. In one respect, by operating the cooling system to supply cooling fluid substantially only as needed by the racks, the cooling system may be operated at a relatively more efficient manner in comparison with conventional cooling systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for cooling a room configured to house a plurality of computer systems, said method comprising:
   providing a plurality of heat exchanger units configured to receive air from said room and to deliver air to said room;
   supplying said plurality of heat exchanger units with cooling fluid from an air conditioning unit;
   cooling said received air through heat exchange with the cooling fluid in the plurality of heat exchanger units;
   sensing temperatures at one or more locations in said room;
   controlling at least one of the temperature of said cooling fluid and said air delivery by said plurality of heat exchanger units to said room in response to said sensed temperatures at said one or more locations; and
   manipulating the workload on the plurality of computer systems to optimize energy efficiency in cooling said plurality of computer systems.

2. The method according to claim 1, wherein said step of controlling at least one of a temperature of said cooling fluid and said air delivery to said room comprises varying an output of said air conditioning unit to control the temperature of said cooling fluid.

3. The method according to claim 1, further comprising:
   determining whether the sensed temperatures at one or more locations in said room are within a predetermined range.

4. The method according to claim 3, further comprising:
   varying the cooling fluid temperature in response to the sensed temperatures at one or more locations in said room being outside of said predetermined range.

5. The method according to claim 4, further comprising:
   increasing said cooling fluid temperature in response to a sum of the sensed temperatures at one or more locations being below said predetermined range.

6. The method according to claim 4, further comprising:
   decreasing said cooling fluid temperature in response to a sum of the sensed temperatures at one or more locations being above said predetermined range.

7. The method according to claim 3, wherein the step of controlling at least one of the temperature of said cooling fluid and said air delivery by said plurality of heat exchanger units comprises manipulating one or more of the plurality of heat exchanger units to increase air delivery to locations in the room having temperatures above the predetermined temperature range.

8. The method according to claim 3, wherein said computer systems are housed in a plurality of racks, said method further comprising:

manipulating the plurality of heat exchanger units to supply air flow to said plurality of racks in a substantially independent manner with respect to each other.

9. The method according to claim 1, wherein the step of manipulating the workload on the plurality of computer systems to optimize energy efficiency in cooling said plurality of computer systems further comprises aggregating the workload to a location in the room, said method further comprising:

manipulating one or more of the plurality of heat exchanger units to increase air delivery to the location in the room where the workload is placed.

10. The method according to claim 1, wherein the step of manipulating the workload on the plurality of computer systems comprises separating the workload to various locations of the room, said method further comprising:

manipulating one or more of the plurality of heat exchanger units to increase air delivery to the various locations of the room where the workload is placed; and manipulating one or more of the plurality of heat exchanger units to decrease air delivery to the one or more locations from where the workload was removed.

11. A system for cooling a room containing one or more computer systems, said system comprising:

a plurality of heat exchanger units configured to receive cooling fluid through a cooling fluid line from an air conditioning unit for cooling the cooling fluid, said plurality of heat exchanger units being further configured to receive air through openings in the plurality of heat exchanger units, wherein said air is cooled through heat transfer with said cooling fluid in the plurality of heat exchanger units;

said plurality of heat exchanger units having at least one fan configured to cause air to flow into and flow out of the heat exchanger unit;

a heat exchanger controller operable to control a supply of said cooling fluid to said plurality of heat exchanger units and operable to control the speed of the at least one fan;

one or more temperature sensors for sensing temperatures at one or more locations in the room;

an air conditioning unit controller configured to operate the air conditioning unit to vary the temperature of said cooling fluid delivered to the one or more locations in the room; and wherein the air conditioning unit controller is configured to manipulate the workload on the plurality of computer systems by varying the locations where the workload is performed to optimize energy efficiency in cooling said plurality of computer systems.

12. The system according to claim 11, wherein said heat exchanger controller is configured to receive environmental condition information from said one or more temperature sensors.

13. The system according to claim 11, wherein said computer systems are housed in a plurality of racks, and wherein said plurality of heat exchanger units are positioned at various locations in said room to supply air flow to said plurality of racks in a substantially independent manner.

14. The system according to claim 11, wherein said cooling device comprises at least one of a variable capacity compressor, a heat exchanger, a chiller, and a cooling device controller configured to control said at least one of said variable capacity compressor, said heat exchanger, and said chiller.

15. The system according to claim 11, wherein the heat exchanger unit controller is configured to manipulate one or more of the plurality of heat exchanger units based upon the manipulation of the workload.

16. The system according to claim 11, wherein the air conditioning unit controller is configured to aggregate the workload to a location in the room, wherein the heat exchanger controller is configured to manipulate one or more of the plurality of heat exchanger units to increase air delivery to the location in the room where the workload is placed.

17. The system according to claim 11, wherein the air conditioning unit controller is configured to separate the workload to various locations of the room, and wherein the heat exchanger controller is configured to manipulate one or more of the plurality of heat exchanger units to increase air delivery to the various locations of the room where the workload is placed and to manipulate one or more of the plurality of heat exchanger units to decrease air delivery to the one or more locations from where the workload was removed.

18. A system for cooling computer systems housed in one or more racks, said racks being maintained in a room, said system comprising:

a plurality of means for receiving air from the room, said plurality of means for receiving air being located at various locations of the room;

a plurality of means for cooling the received air in the plurality of means for receiving air, said plurality of means for cooling including means for receiving cooling fluid from an air conditioning unit;

a plurality of means for delivering cooled air to said computer systems;

means for measuring temperatures at one or more locations in said room;

means for controlling delivery of said cooled air through said plurality of means for delivering cooled air in response to the temperature measurements;

means for controlling the temperature of said cooling fluid; and means for manipulating the workload on the plurality of computer systems to optimize energy efficiency in cooling said plurality of computer systems.

19. The system according to claim 18, further comprising:

means for controlling delivery of cooling fluid through said cooling means.

20. The system according to claim 18, further comprising:

means for manipulating one or more of the plurality of means for receiving air to increase air delivery to locations in the room having temperatures above a predetermined temperature range.

21. The system according to claim 18, further comprising:

means for manipulating the plurality of means for receiving air to supply air flow to said plurality of racks in a substantially independent manner with respect to each other.

22. A computer readable storage medium on which is embedded one or more computer programs, said one or more computer programs implementing a method for cooling a room configured to house a plurality of computer systems, said one or more computer programs comprising a set of instructions for:

supplying a plurality of heat exchanger units configured to receive air from the room and to deliver air to said room with cooling fluid from an air conditioning unit;

cooling said received air through heat exchange with the cooling fluid in the plurality of heat exchanger units;

sensing temperatures at one or more locations in said room;

controlling at least one of the temperature of said cooling fluid and said air delivery by said plurality of heat exchanger units to said room in response to said sensed temperatures at said one or more locations; and manipulating the workload on the plurality of computer systems to optimize energy efficiency in cooling said plurality of computer systems.

23. The computer readable storage medium according to claim 22, said one or more computer programs further comprising a set of instructions for:

manipulating one or more of the plurality of heat exchanger units to increase air delivery to locations in the room having temperatures above a predetermined temperature range.

24. The computer readable storage medium according to claim 22, said one or more computer programs further comprising a set of instructions for:

manipulating the plurality of heat exchanger units to supply air flow to said plurality of racks in a substantially independent manner with respect to each other.

* * * * *